(12) United States Patent
Arsovski et al.

(10) Patent No.: US 7,218,135 B2
(45) Date of Patent: May 15, 2007

(54) METHOD AND APPARATUS FOR REDUCING NOISE IN A DYNAMIC MANNER

(75) Inventors: Igor Arsovski, Williston, VT (US); Hayden C. Cranford, Jr., Cary, NC (US); Joseph A. Iadanza, Hinesburg, VT (US); Sebastian T. Ventrone, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 47 days.

(21) Appl. No.: 11/163,015

(22) Filed: Sep. 30, 2005

(65) Prior Publication Data

US 2007/0075731 A1    Apr. 5, 2007

(51) Int. Cl.
*H03K 19/003* (2006.01)
*H03K 17/16* (2006.01)

(52) U.S. Cl. .............................. 326/26; 326/22; 326/33

(58) Field of Classification Search .................. 326/21, 326/22, 26, 31, 33
See application file for complete search history.

(56) References Cited

U.S. PATENT DOCUMENTS 6,806,729 B2 * 10/2004 Wallace et al. ................ 326/33
7,024,570 B2 *  4/2006 Hoehler ....................... 713/310

\* cited by examiner

*Primary Examiner*—Anh Q. Tran
(74) *Attorney, Agent, or Firm*—W. Riyon Harding

(57) ABSTRACT

An integrated circuit device includes functional logic, an anti-noise machine, and state monitoring points providing the anti-noise machine with an interface to the functional logic for monitoring states of the functional logic. The anti-noise machine includes indicia defining noise precursor states for the functional logic, and recognition logic coupled to the state monitoring points. The anti-noise machine is operable to generate anti-noise responsive to the recognition logic detecting in the functional logic noise precursor states matching the indicia.

20 Claims, 8 Drawing Sheets

METHOD AND APPARATUS FOR REDUCING NOISE IN A DYNAMIC MANNER

BACKGROUND

1. Field of the Invention

This invention concerns reducing power supply noise within integrated circuits, and, more particularly, concerns reducing the noise in a dynamic manner in response to events within the integrated circuit.

2. Related Art

An Integrated Circuit (IC) contains transistors connected together to implement one or more digital, analog or mixed signal functions. In addition to their signal connectivity, transistors within the IC must be supplied by a power source of a specific voltage and tolerance for proper operation of the IC. With succeeding generations of IC technology, both the number and density of transistors on an IC have increased while the power supply voltage and tolerance values have been reduced to offset increases in IC power consumption which is a function of transistor count, power supply voltage and switching frequency. With the development of higher density and higher frequency integrated circuits, it has been recognized that the switching of the thousands of transistors within the IC will create power supply noise, or rapid fluctuation of the power supply voltage within the IC. As an example of the noise generated on power supply bus networks, FIG. 1 illustrates both high frequency fluctuation in the supply voltage, which is due to variations in current demand within each cycle, and low frequency fluctuation in supply voltage, which is due to cumulative affects of current demand variation due to changes in IC function as a result program control or data sensitivity on the power supply resistor-inductor-capacitor (RLC) bus network. In past generations of IC families, the addition of passive capacitance coupling the power supply to the GROUND bus within the IC has been used to stabilize power supply voltage, however, with the trend to lower supply voltages and tighter voltage variation limits at the transistor, increased capacitor sizes are required within the IC to provide stabilization. Also, the level of power supply noise immunity is being continuously reduced. With both current and future IC generations, power supply noise induced by the switching of transistors within the IC itself can result in functional failure of the IC. As a result, power supply noise within the IC is becoming an increasingly serious problem for reliable operation. Thus, a need exists for an improved structure and method for mitigating power supply noise in integrated circuits.

SUMMARY OF THE INVENTION

The present invention addresses the foregoing need. In one form of the invention, and integrated circuit device, includes functional logic, an anti-noise machine, and state monitoring points providing the anti-noise machine with an interface to the functional logic for monitoring states of the functional logic. The anti-noise machine includes indicia defining noise precursor states for the functional logic, and recognition logic coupled to the state monitoring points. The anti-noise machine is operable to generate anti-noise responsive to the recognition logic detecting noise precursor states in the functional logic matching the indicia.

In another aspect, the anti-noise machine includes a memory having noise response data stored therein. The noise response data corresponds to respective ones of the indicia. Responsive to detecting a noise precursor state matching one of the indicia, the recognition unit is operable to decode the indicia to an address in the memory for the indicia's corresponding response data. The anti-noise machine also includes a buffer having an input, an output and a predetermined throughput latency there between corresponding to latency of noise events with respect to the noise precursor states, wherein the recognition unit is operable in cycles to successively load respectively addressed response data into the buffer input for triggering the anti-noise machine to generate the anti-noise at predetermined times with respect to the noise events responsive to the response data being output by the buffer.

In still another aspect of the invention, the device includes a first power supply rail for the functional unit supplied at a first voltage level and a second supply rail supplied at a second voltage level elevated above the first voltage level. The anti-noise unit also includes a response unit having a number of capacitors and controllers for the respective capacitors. An electrode of a first such capacitor is coupled by a first switch to the first power supply rail and by a second switch to the second power supply rail. The controller for the first capacitor is operable to charge the first capacitor to the second voltage level via the first capacitor's second switch, receive the response data from the buffer output, and generate the anti-noise responsive to the received response data. Generating the anti-noise includes the controller for the first capacitor discharging the charged capacitor to the first power supply rail via the charged capacitor's first switch.

In yet another aspect, the response unit includes a second such capacitor coupled by a first switch for the second capacitor to the first power supply rail and by a second switch for the second capacitor to the second power supply rail. The controller for the second capacitor is operable to conductively couple the second capacitor to the second power supply rail via the second capacitor's second switch concurrently with the discharging of the first capacitor.

In a still further aspect of the invention, the device includes a clock operable to generate a timing signal for operating cycles and the noise response data includes packets having timing adjustment portions. Such a controller is operable to adjust timing of the triggering relative to the timing signal responsive to the timing adjustment portion of such a response data packet.

Additionally, the noise precursor states include at least one of the following: a state wherein a clock domain of the functional logic is activated or deactivated, a state wherein a functional region of the functional logic is activated or deactivated, a state wherein an array of the functional logic is accessed, and a state wherein instructions are queued in the functional logic for a certain series of functional logic operations.

In one alternative, the response unit of the device has a number of current sources and controllers for the respective current sources. Such a current source is coupled to the first and second power supply rails. The controller for such a current source is operable to receive the response data from the buffer output and generate the anti-noise responsive to the received response data. Generating the anti-noise includes the controller triggering the current source to inject current to the first power supply rail.

In another alternative, an integrated circuit device includes functional logic and recognition logic coupled to the functional logic and operable to monitor states of the functional logic, wherein the recognition logic includes indicia defining noise precursor states of the functional logic. A memory of the device has noise response data corresponding to the indicia stored therein. Responsive to detecting a noise precursor state matching one of the indicia, the recognition unit is operable to decode the indicia to an address in the memory for the indicia's corresponding response data. The recognition unit is operable in cycles to successively load respectively addressed response data into a buffer input. The buffer has an input, an output and a predetermined throughput latency there between corresponding to latency of noise events with respect to the noise precursor states. A response unit has a number of noise sources and controllers for the respective noise sources. The controller for such a noise source is operable to trigger the noise source to generate noise on a first power supply rail for the functional logic responsive to receiving the response data from the buffer.

In another form of the invention, a method for reducing noise in an integrated circuit device includes monitoring states of functional logic in an integrated circuit device by recognition logic of an anti-noise machine. The anti-noise machine includes indicia defining noise precursor states for the functional logic and a memory having noise response data corresponding to the indicia stored therein. The indicia is decoded to addresses in the memory for the indicia's corresponding response data responsive to the recognition logic detecting noise precursor states in the functional logic in which the noise precursor states match the indicia. A buffer has an input, an output and a predetermined throughput latency there between corresponding to latency of noise events with respect to the noise precursor states. Respectively addressed response data are loaded into the buffer input and anti-noise is generated at predetermined times with respect to the noise events responsive to the noise response data being output by the buffer.

In another aspect, the method includes simulating noise events for nodes within the functional logic responsive to predetermined simulation patterns. States of the functional logic are defined in which the states precede respective ones of the simulated noise events and indicia of noise precursor states are formed in the anti-noise machine responsive to magnitudes of the noise events and the defined states of the functional logic.

Additionally, the method of claim 16, wherein the simulation patterns include simulated instructions and operand data and such a state include ones of the simulated instructions and operand data.

Other variations, objects, advantages, and forms of the invention will become apparent upon reading the following detailed description and upon reference to the accompanying drawings.

DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment read in conjunction with the accompanying drawings.

FIG. 1 illustrates a noise on an integrated circuit chip's voltage supply, according to the prior art.

FIG. 2 provides a flow chart for generation and validation of an IC containing an anti-noise machine, according to an embodiment of the present invention FIG. 3 illustrates certain components of an IC, including an anti-noise machine and its sub components, according to an embodiment of the present invention.

DETAILED DESCRIPTION OF A PREFERRED EMBODIMENT OF THE INVENTION

In the following detailed description of the preferred embodiments, reference is made to the accompanying drawings illustrating embodiments in which the invention may be practiced. It should be understood that other embodiments may be utilized and changes may be made without departing from the scope of the present invention. The drawings and detailed description are not intended to limit the invention to the particular form disclosed. On the contrary, the intention is to cover all modifications, equivalents and alternatives falling within the spirit and scope of the present invention as defined by the appended claims. Headings herein are not intended to limit the subject matter in any way.

Figure 1:
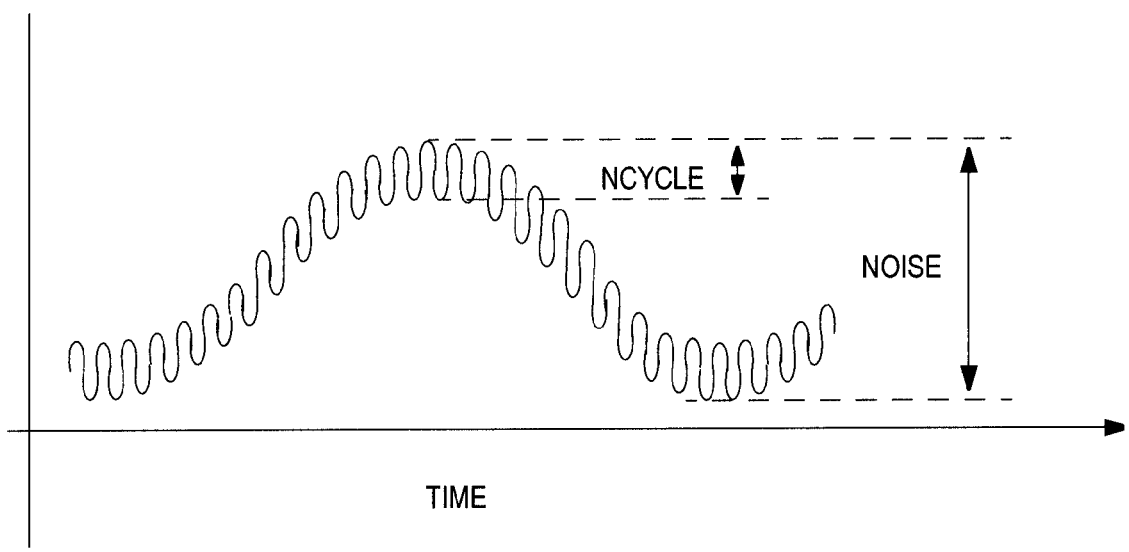
Figure 2A:
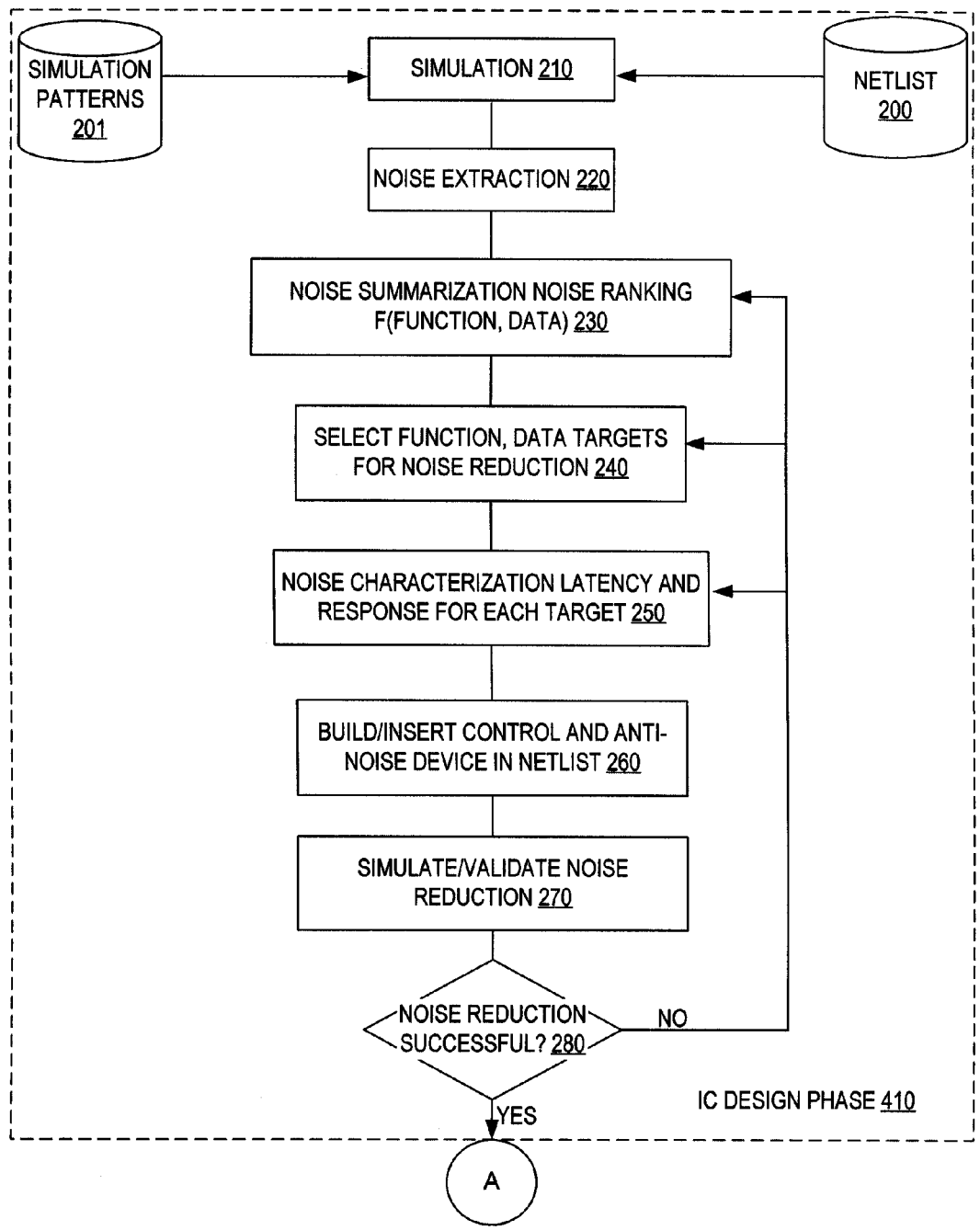
Figure 2B:
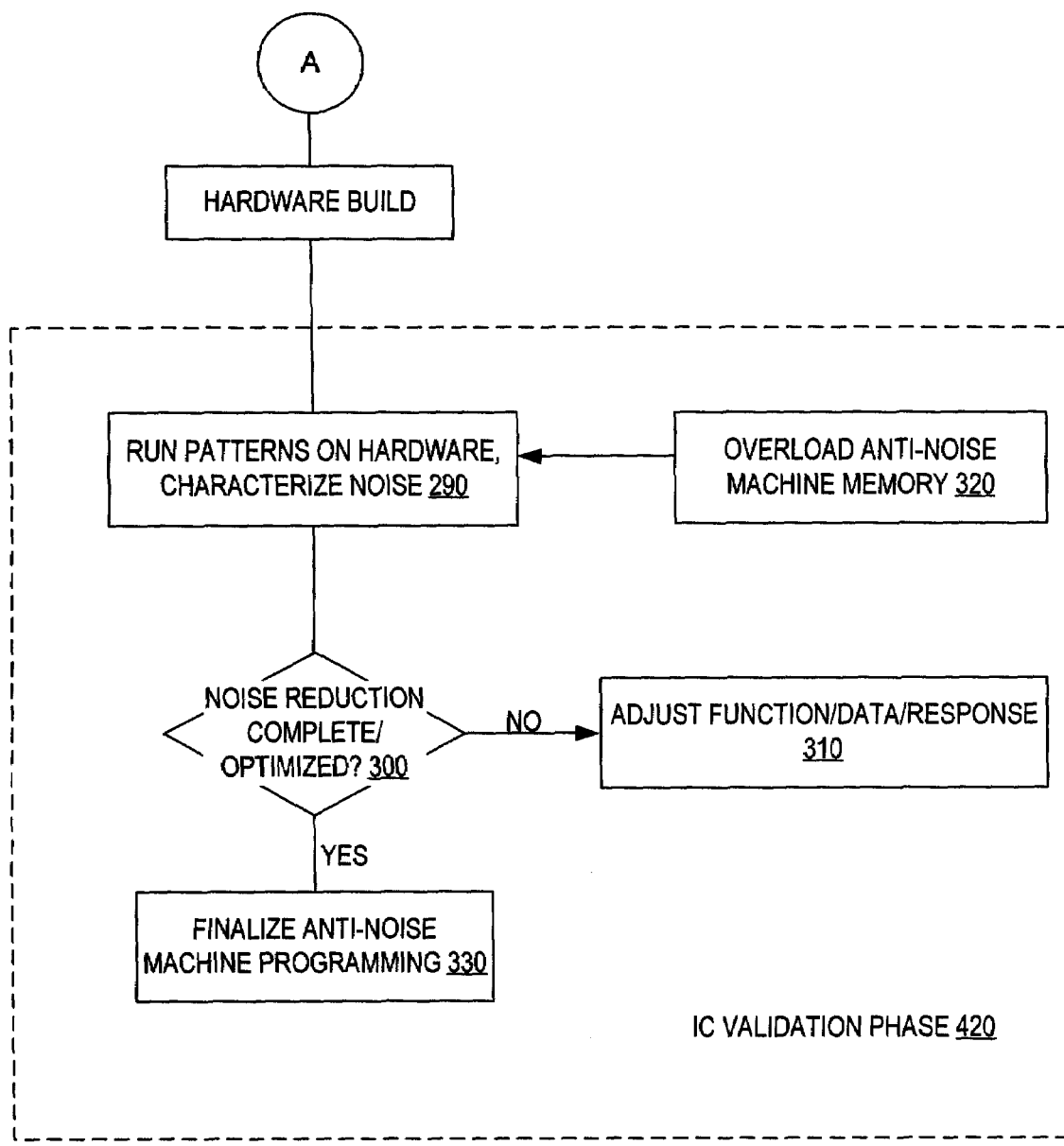

FIG. 2 illustrates a method for generation and verification of an IC, according to an embodiment of the present invention. The IC includes an anti-noise machine which dynamically anticipates functional events within the IC that generate significant power supply noise and responds in counteracting synchrony to reduce noise on the chip.

The method includes an IC design process 410, in which an anti-noise machine specific to the IC is defined and implemented, and an IC validation phase 420, during which the anti-noise machine operation is validated and/or optimized in hardware.

Within IC design process 410, an IC netlist 200, a behavioral netlist, or a combination thereof are stimulated in step 210 using a set of simulation patterns 201 to determine noise, i.e., voltage fluctuation, on the IC's power supply. Netlist 200 may be extracted from the IC physical design, including transistors, resistors, capacitors and possibly inductors associated with the IC's function and power distribution. The netlist 200 may include logic behaviorals with current demand modeling and estimates of power supply network resistance, capacitance and inductance parameters based on a floor plan of the IC. The patterns simulate both a range of functional behavior or instruction processing as well as expected data content, defined as "operand data." Patterns chosen for simulation encompass all different operating modes of the IC, including enablement and disablement of various clock domains, logic functions or "voltage islands," memory accesses, I/O port activity and analog core function.

During noise extraction 220, simulation results are post-analyzed to determine the power supply noise at multiple nodes within the IC as a function of instruction and operand data.

Next, in operation 230, noise events are identified, ranked with regard to their magnitude, and summarized or grouped by instruction and/or operand data type, and noise precursor signature (NPS) vectors are responsively generated. These NPS vectors economically indicate sets of noise event precursor states (also referred to herein as "noise event precursors," "noise precursors," or simply "precursors") to be recognized by the anti-noise machine. That is, these vectors define sets of events as described herein below for which the anti-noise machine generates anti-noise in order to reduce the effects of noise arising from the events. (Note also, such an "NPS vector" is usually referred to herein simply as a "noise precursor signature" or "NPS.")

One significant contributor to power supply noise in an IC is periodic activation/deactivation of clock domains or functional regions of the chip known as "voltage islands" as a method of power management. Activation/deactivation cycling creates near-instantaneous changes in power supply current demand, which in-turn, creates power supply noise. Therefore, the identified noise precursors may include transitions in functional or power management mode within the IC. These functional or power management transitions may be priority candidates for noise reduction based on their noise magnitude alone, i.e., exclusive of data activity.

Similarly, array accesses to registers or CAM's may be identified as precursors that are priority candidates for noise reduction. If noise generated in the simulation process 210 (and its effect on specific nodes, as determined in process 220) is relatively similar for all accesses of a CAM or other array structure, and is not highly dependent upon data content, then such accesses may be summarized as a single NPS, exclusive of data content. On the other hand, if power supply noise varied substantially dependent on operand data during simulation 210, multiple NPS vectors may be generated for summarizing the operand data into low, medium, and high noise effect, for example. Alternatively, an NPS may be generated for the worst case operand data.

More generally, noise simulated in process 210 and analyzed in process 220 can be divided into subclasses such as 1 through 10, for example, based upon the power supply noise magnitude, as measured by the noise power in designated frequency ranges. Instruction/operand data for all simulation vectors in each subclass are analyzed to define one or more unique identifiers for the subclass. Identifiers may be formed through either inclusion or omission of portions of the instruction and operand data being simulated in IC design 500. In a first example, subclass 1 could represent background noise only, while subclass 10 could represent the highest level of power supply noise. In another example, subclass 1 could represent a class of functional operations within IC 500 while subclass 10 represents logic power-up/power-down events.

Also included in the summarization process 230 is recognition of linked events. That is, operations within the IC, either in logic or in a processor, flows in a known order in many cases. For instance, in a processor, the linked operations of instruction fetch, instruction decode, data fetch, execution and store are well known. Therefore noise generated by a multi-cycle operation may be summarized into a single NPS vector.

Although simplifications such as described above are possible, the effect that data has on noise generation must also be taken into account. That is, the data that IC 500 operates upon also influences noise generation. If IC 500 stores, retrieves, receives, transmits or otherwise processes data that is highly complimentary from cycle to cycle, the node toggle densities of IC 500 will be higher than in cases where data is static. Higher node toggle densities within IC 500 are associated with greater noise effects. As an example IC 500 may execute an ADD function on two operands. Should the addition produce no, or few carries, the node toggle density and associated noise will be lower than if the two operands produce a large number of carries. With this data effect, the number of possible noise states has the potential to become very large. Consequently, in order to reduce the complexity and scale involved in characterizing effects of data on noise generation, summarization 230 categorizes the data, such as by compressing the data or simply considering only certain significant bits of the data. In one embodiment, operand data is thus classified into four noise generating categories which can be expressed as two binary bits. Some integrated circuits allow for selection of clock frequency over such a substantial range that the particular clock frequency that is selected can affect the noise generated by a logic operation. In these cases, NPS vector definitions may be extended to encompass operational clock frequency. In a similar manner, the NPS vector definition may be further extended to include voltage or temperature events, if such events contribute significantly to the noise signature.

Ranked noise data from 230 is used to select events, as defined in and anticipated by corresponding NPS vectors, to target for noise reduction in step 240. The number of NPS vectors selected is dependent on the allowed size and complexity of the instruction/operand recognition hardware to be implemented. Summarization or grouping of functions into NPS vectors in block 230 expands coverage of the anti-noise machine to a larger number of functional instruction/operand events, while minimizing the complexity of the anti-noise machine.

Next, noise characterization step 250 determines how much anti-noise to generate, as well as when and where to generate it, for each respective one of the NPS vectors selected in step 240. More specifically, magnitude of the anti-noise response is determined responsive to the magnitude of the noise generated during simulation process 210, the local capacitance of the power supply in the region of the functional circuits from which the noise arose, the local capacitance of the power supply in the region of the response means, and the charge injection capability of the response means.

It should be recognized that in many cases, such as in a case where functional logic 510 includes a processor, a single NPS may represent multiple cycles of activity in logic 510. In such a case, the anti-noise response must be multi-cycle in duration. Consequently, either single or multiple cycles of response data may be generated based on both the NPS vector and the noise that results from the NPS activity.

In addition, because an NPS is a precursor to a noise generating event, the corresponding anti-noise response must occur in a downstream cycle, i.e., after the precursor event. For the purposes of this disclosure, a system with uniform precursor-to-response latency is shown. However, one skilled in the art will recognize that a parallel system may be constructed to account for differing latencies. Also, it should be noted that the optimum placement for timing of a particular anti-noise response is not always at the beginning of a cycle when a certain noise event occurs, i.e., the target cycle. For example, the placement may be late in the previous cycle, or it may be early, centered or late in the target cycle. It may even be early in the subsequent cycle. Therefore, operation 250 not only calculates the magnitude of the response, but its timing in relation to the target cycle.

Once the NPS vectors are selected and anti-noise responses are defined, design step 260 generates and instantiates circuitry for the anti-noise machine 520 and its interface to functional logic 510. The interface includes logic monitoring points within IC functional logic 510 to obtain the logic state of the IC. The anti-noise machine includes a processing function for NPS identification from the IC logic state, an addressing generation function for translating an identified NPS into single or multiple addresses and a memory for storage of NPS definition and NPS response data. Also included within the anti-noise machine is one or more response means.

With anti-noise machine instantiation complete, the revised IC, i.e., the IC including anti-noise machine 520 and interface to functional logic 510, is again modeled and simulated to determine remaining levels of power supply noise in step 270. Should additional improvements be required, decision box 280 provides an iterative return to summarization/ranking 230, selection 240 and characterization 250 functions. With successful exit from the IC design process 410, the IC, including the embedded anti-noise machine, may be fabricated and IC validation process 420 may begin.

Within step 420, simulation patterns, which may include patterns 201, are used to characterize the hardware in step 290. That is, simulation patterns are applied to the IC and resulting power supply noise is monitored on numerous selected locations of the IC, as well as the functioning of the IC. At the completion of process 290, noise results are analyzed to determine the efficacy of the anti-noise machine. After initial hardware characterization, a decision 300 is made as to whether the anti-noise machine has sufficiently reduced noise on the IC, such as by comparing the noise generated by the simulation patterns in process 290 to one or more predetermined maximum noise levels or by running a test program on the IC to confirm that functional performance is correct. If the generated noise is not below the predetermined level or levels or the functional performance is not correct, then at 310 anti-noise programming is repeated. That is, the anti-noise machine is adjusted, which may include NPS vector recognition changes, timing changes, response magnitude, or response location changes possible within hardware limitations defined during IC design process 410. The process for adjusting the anti-noise machine includes steps similar to processes 230, 240 and 250. New results are overloaded into anti-noise machine memory, through either external provision or memory rewrite in step 320. The IC is subsequently re-characterized in step 290, etc. Iteration of steps 290, 300, 310 and 320 optimizes the anti-noise response, whereupon in response to generated noise below the predetermined level or levels and correct functional performance in step 300 the anti-noise programming is finalized in step 330 and may be burned into a nonvolatile memory within the IC, which is used to effect mask changes to a ROM in the final IC design. Alternatively, the programming may be provided to the end user of the IC for external supply to the IC in a system environment.

Figure 3:
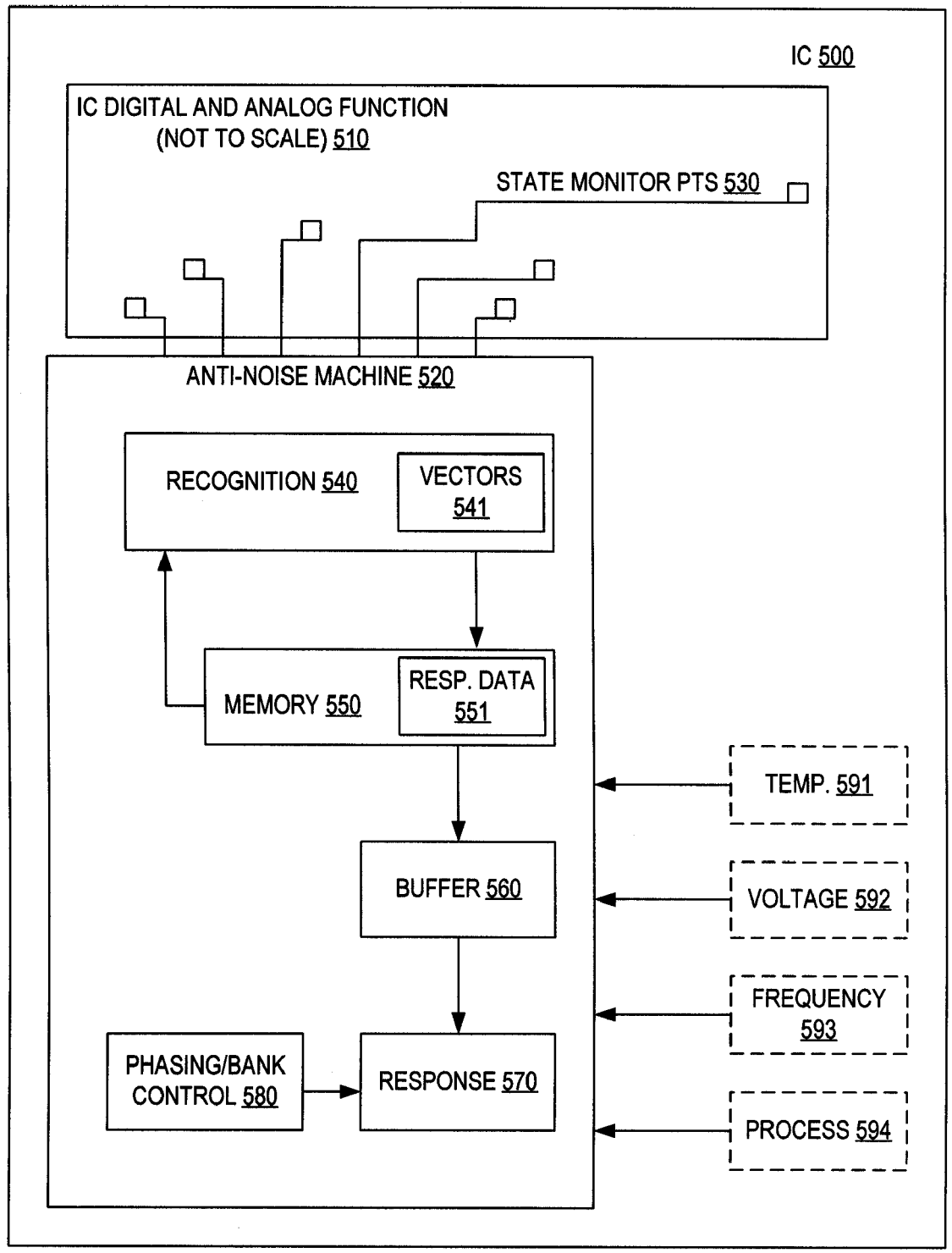

Referring now to FIG. 3, IC 500 is illustrated, according to an embodiment of the present invention. IC 500 is a product of the IC design process 410 of FIG. 2, and contains functional logic 510, which may be of a digital, analog or of mixed signal nature. During functional operation, logic 510 generates power supply noise due to changes in current demand caused by intra-cycle clock/data/output driver switching, periodic activity within large functions such as ALU's, microprocessors, RAM's, registers and CAM's and longer periodic power management cycling of functional units on and off to conserve DC power, as previously described herein above.

IC 500 also contains anti-noise machine 520, according to an embodiment of the present invention. An input interface to anti-noise machine 520 from functional logic 510 is made by state monitor points 530. Monitor points 530 provide the present functional state of IC 500 which may include functional state information, next state information, operand data, power management request data or dummy signals specifically designed into functional logic 510 to serve as noise precursors, to machine 520. The number and locations of monitor points 530 are derived and implemented into hardware as part of NPS definition and machine insertion in block 410 of FIG. 2.

Within anti-noise machine 520, recognition function 540 monitors inputs from points 530 to detect the occurrence of events defined by noise precursor signature vectors. Recognition function 540 may be implemented as synthesized or application-specific logic dedicated to detecting such events and decoding each NPS. Alternatively, recognition function 540 may be implemented by means including a set of programmable comparators to allow alteration of NPS detection, an embedded field programmable logic macro, or as a micro controller/microprocessor/DSP-type unit to provide additional flexibility in NPS interpretation and response selection. In programmable embodiments, memory 550 is used to provide programming data or the instruction set to recognition unit 540. In this case, it is recognized that memory 550 need not be a single unit and may be any combination RAM, NVRAM, CAM, register, register array or fuse macro. Accordingly, recognition unit 540 includes NPS vectors, which may be implemented as either logic circuitry or as indicia stored in memory 550. Further, memory 550 includes response data associated with each NPS.

Responsive to unit 540 detecting an event defined by an NPS within logic function 510, recognition unit 540 decodes the NPS to an associated address or series of addresses for memory 550 locations that hold noise response data corresponding to the NPS. Optionally, recognition function 540 may also be affected by at least one of temperature sensor block 591, voltage sensor block 592, clock frequency sensor/information 593 or process sensor/information 594 to affect response identification. Specifically, in one embodiment of the invention, recognition unit 540 decodes an NPS to a partial address or series of addresses and decodes the remainder of the address responsive to a temperature signal from block 591, a voltage signal from block 592, a clock frequency signal from block 593, a process signal from block 594, or a combination of such signals. Response data stored in memory 550 contains magnitude, timing, and, in some cases, cycle latency portions.

Recognition unit 540 retrieves response data at the address or series of addresses in memory 550 and directs it to buffer 560, which provides a first-in-first-out (FIFO) or pipeline structure with latency set to properly merge response data with the upcoming noise event. In an embodiment of the invention in which NPS vectors are defined with varying latency requirements, multiple buffers 560 with varying latency are placed in parallel, with data direction provided by a cycle latency portion of the retrieved response. One skilled in the art will recognize that data input to alternate buffers may be nulled or data for other NPS vectors loaded. Response data that is output from buffer 560 is provided to response unit 570. Unit 570, in addition to being driven by response data is controlled by phasing/bank controller 580 which provides bank selection and multiple clock phases for internal operation of response unit 570, which is described herein below. Although shown as a single unit, response unit 570 may be replicated or distributed throughout functional block 510 with identical or unique data control to optimally affect power supply noise throughout IC 500. In an embodiment of the invention in which the anti-noise machine 520 is implemented with NPS vectors of varying cycle latency requirements, multiple response units 570 are included, each dedicated to a buffer 560 of differing latency.

Figure 4A:
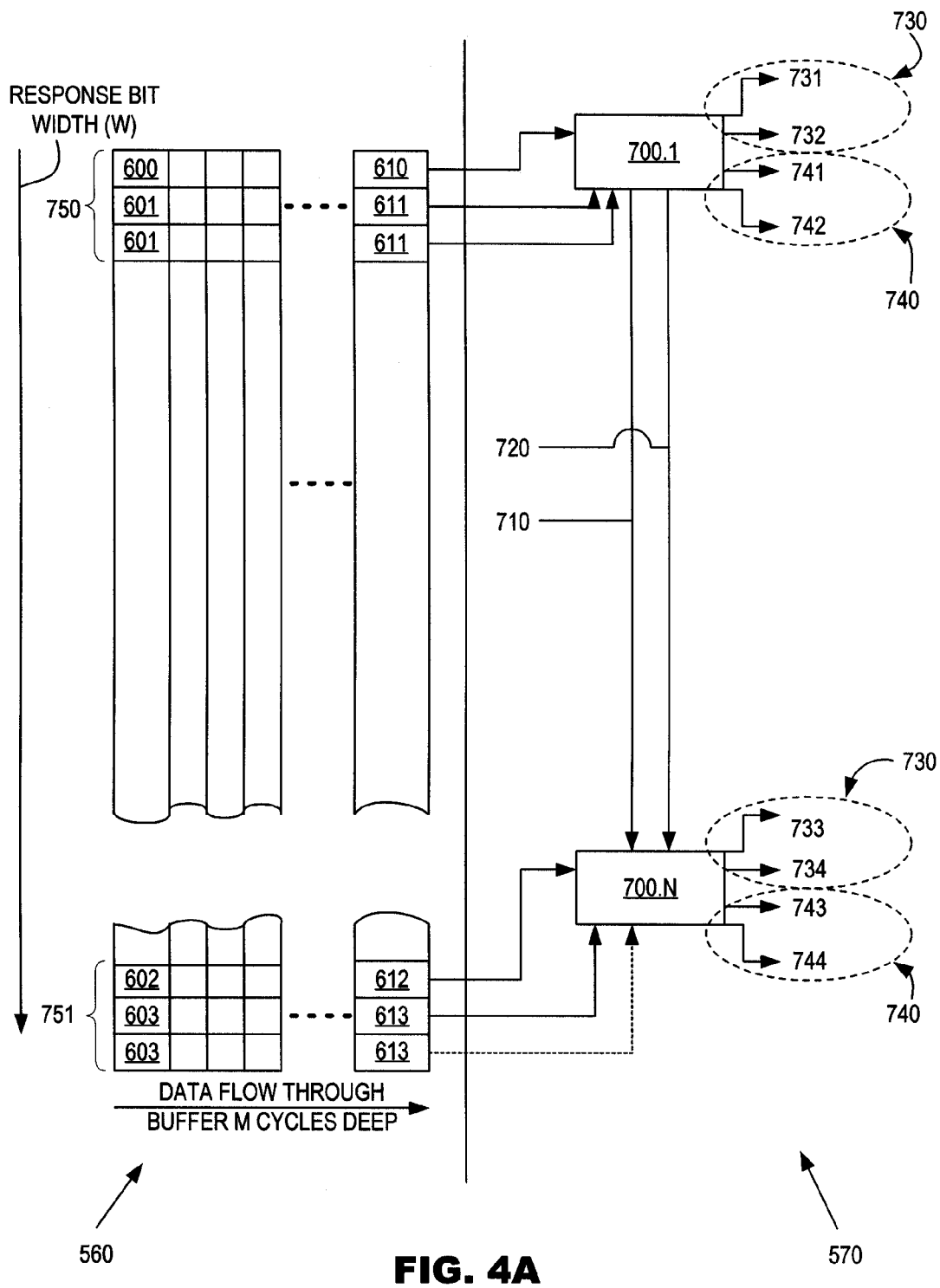
FIG. 4A illustrates a buffer of the anti-noise machine of FIG. 3, including delay/control units, according to an embodiment of the present invention.

FIG. 4A illustrates certain aspects of buffer 560 and response unit 570, according to an embodiment of the present invention. Buffer 560 is of a width (W) equal to the digital encoding of the noise response data retrieved from memory 550. The width W, may be further divided into packets, each packet capable of containing data and timing sub-portions for a single capacitor within response unit 570. During successive operational cycles, as recognition unit 540 identifies respective noise precursors responsive to NPS vectors, recognition unit 540 loads one or more noise response data packets, such as illustrated packets 750 and 751, to buffer 560 from memory 550. The same number of such noise response data packets is loaded in each case, but each packet does not necessarily cause a capacitor to discharge. In an embodiment of the invention in which all capacitors are the same size, the number of packets that cause their respective capacitors to discharge depends on the magnitude of the anti-noise indicated by the NPS vector giving rise to the noise response data packets.

In the illustrated instance, packet 750, which is a first portion of the noise response data, includes data sub-portion 600 and timing sub-portions 601. Likewise, packet 751, which is a second portion of the noise response data for a particular NPS vector, also includes data sub-portion 602 and timing sub-portion 603. With successive clock cycles, noise response data is moved, i.e., shifted, through buffer 560 to its output. That is, in the instance shown, after data sub-portion 600 and timing sub-portion 601 have advanced by M cycles, where M defines the depth of buffer 560 and the planned latency of the particular buffer 560, they will be at the output of buffer 560, i.e., in the position of data sub-portion 610 and timing sub-portion 611.

Data sub-portion 610 and timing sub-portion 611 buffer 560 outputs are provided as inputs to delay/control unit 700.1 of response unit 570 for triggering a single capacitor thereof. FIG. 4A additionally illustrates a second delay/control unit 700.N with inputs 612 and 613 for triggering a second capacitor of response unit 570. (It should be understood that for each NPS vector there is a response data packet and a delay/control unit for each capacitor, although not all are shown in the illustration. If an NPS vector calls for more anti-noise, more delay/control units in response unit 570 and more capacitors are triggered by the response data packets. Likewise, for less anti-noise, fewer delay/control units and fewer capacitors are triggered.) Delay/control units 700.1, etc. also receive a phase selection input 710 and a launch clock 720 from phasing/bank control unit 580 (FIG. 3).

Provision within response unit 570 of at least two banks of capacitors alternately selected for use allows for adequate pre-charge for each bank of response unit 570 regardless of suppression timing. In response to inputs 610, 611, 612, 613, 710 and 720, delay/control units 700.1 and 700.N produce output signal 730, in which unit 700.1 produces first sub-portions, i.e., signals 731 and 732 for a first capacitor of a first capacitor bank of response unit 570, and unit 700.N produces second sub-portions, i.e., signals 733 and 734 for a second capacitor of the first capacitor bank of response unit 570. In the illustrated instance, the units 700.1 and 700.N also produce output 740, in which unit 700.1 produces sub-portions 741 and 742, and unit 700.N produces sub-portions 743 and 744 for respective capacitors of a second capacitor bank of response unit 570.

Figure 4B:
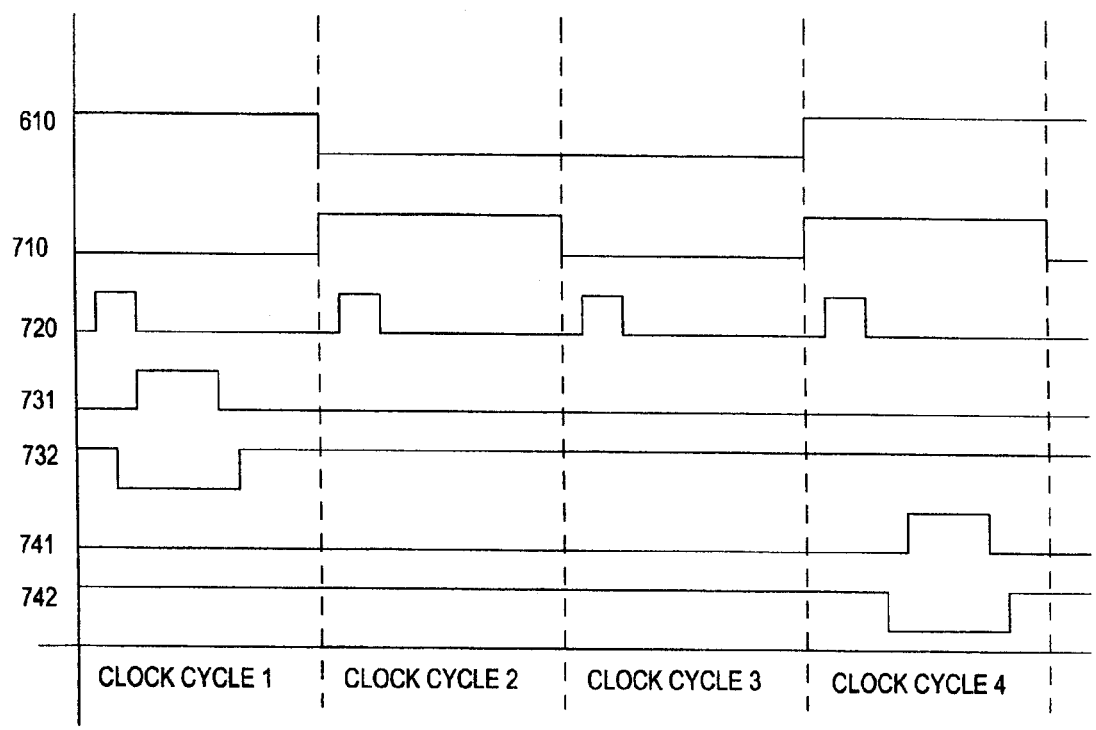
FIG. 4B illustrates certain ones of the control signals generated by the delay control units of FIG. 4A, according to an embodiment of the present invention.

Referring now to FIG. 4B, control signals generated by delay/control unit 700 are illustrated, according to an embodiment of the present invention. Phase selection signal 710 alternates between selection of the first and second capacitor banks of response unit 570 during successive clock cycles. Data 610 provided to unit 700.1 selects or deselects a capacitor of response unit 570 for use in the current cycle. Clock 720 provides a launch edge for activation of all capacitors of response unit 570.

More specifically, responsive to data 610 selecting a capacitor for use, unit 700.1 pulses one of outputs 731 and 741 active and one of outputs 732 and 742 inactive during the current cycle. In particular, responsive to phase selection signal 710 selecting first capacitor bank, as shown at clock cycle 1 by the active condition of data signal 610, unit 700.1 pulses 731 active and 732 inactive, which delivers a pulse of stored charge from the corresponding capacitor of the first bank to a power supply rail coupled to functional unit 510, thereby generating anti-noise. At the same time during clock cycle 1, 741 remains inactive and 742 remains active, which recharges the corresponding capacitor of the second bank. Likewise, as shown at clock cycle 4, responsive to selection of the second bank via 710, unit 700.1 pulses 741 and 742, which delivers a pulse of stored charge from the corresponding capacitor of the second bank to the power supply rail coupled to functional unit 510. At the same time during clock cycle 2, 731 and 732 remain respectively inactive and active, which recharges the corresponding capacitor of the first bank.

Responsive to timing sub-portion 611, unit 700.1 selects positions of the pulses relative to clock 720 using selectable delay elements. Responsive to data 610 deselecting its corresponding capacitor for noise suppression, as shown at clock cycles 2 and 3 by the inactive condition of data signal 610, unit 700.1 generates no pulses on its output signals 731, 732, 741 and 742 within the cycles.

Figure 5A:
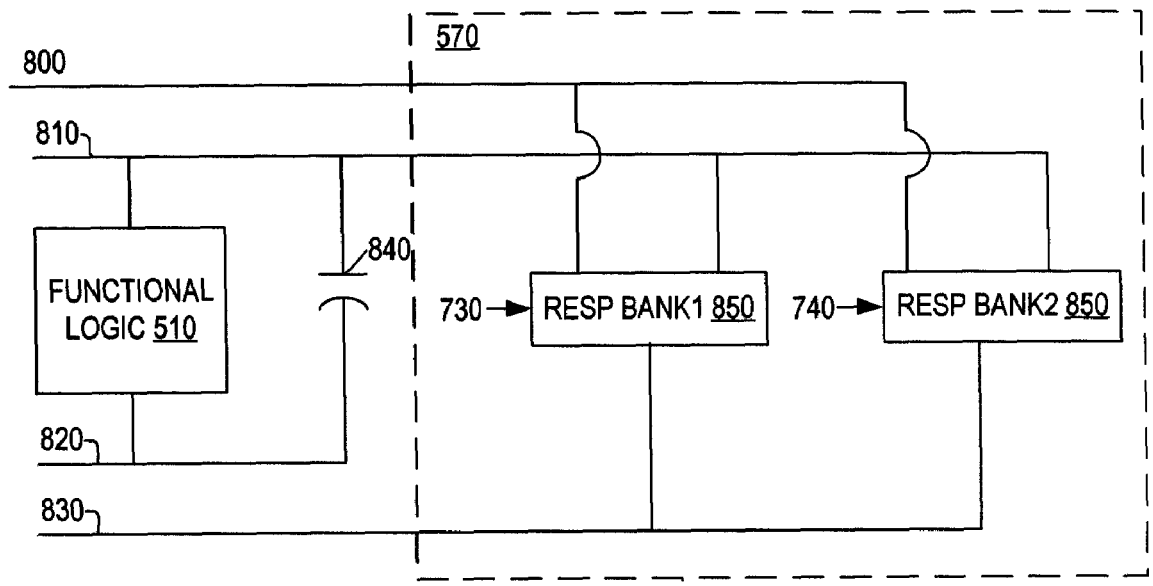
FIG. 5A illustrates a noise response unit of the anti-noise machine of FIG. 3, according to an embodiment of the present invention.
Figure 5B:
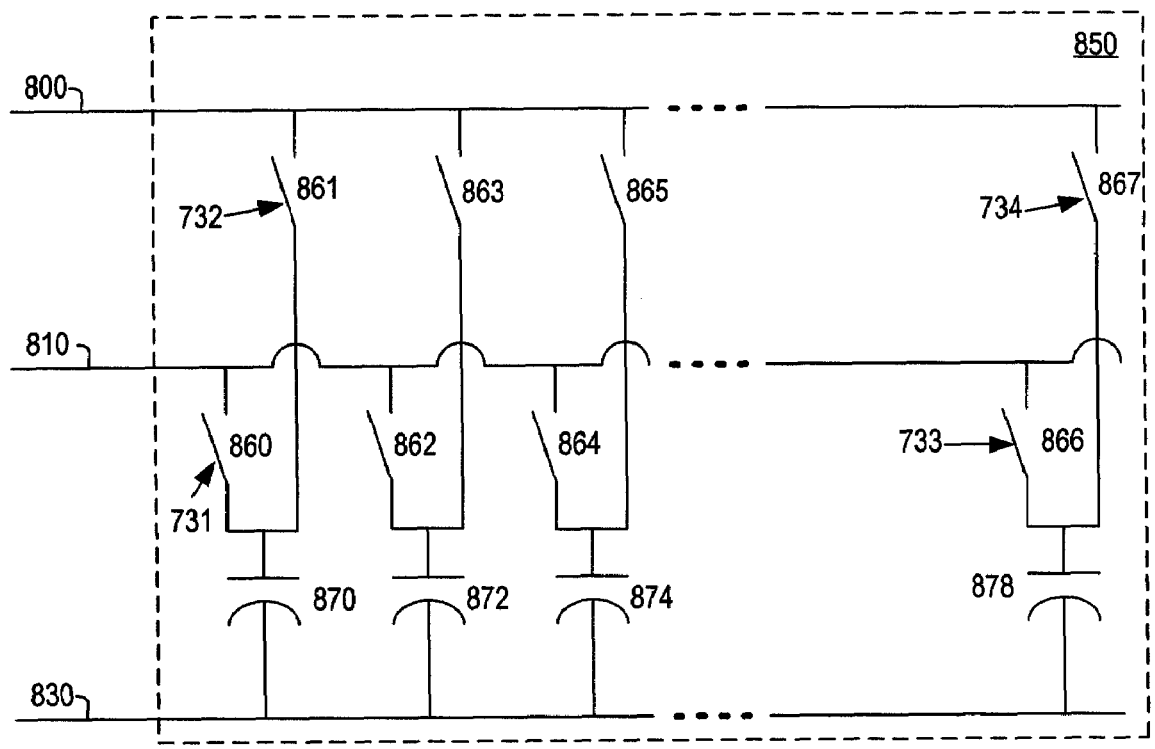
FIG. 5B illustrates a capacitor bank of the anti-noise machine of FIG. 3, according to an embodiment of the present invention.

An example embodiment of response unit 570 related to functional logic 510 of IC 500 is shown in FIG. 5A and expanded upon in FIG. 5B. Functional logic 510 is provided power supply rail 810 and reference rail 820 which may be earth ground or other potential. Typically, decoupling capacitance 840 is also provided for between 810 and 820. Response unit 570 includes two banks 850 of capacitors controlled by outputs 730 and 740 of buffer 560. Each bank within response unit 570 is connected to power supply rail 810 as well as high voltage supply rail 800 that is elevated above power supply 810. High voltage supply rail 800 may be sourced internal or external to IC 500 and may be derived from voltage regulators, as is known in the art. Banks 850 are also connected to reference rail 830, which may be common with reference rail 820, or supplied by a potential lower than 820 provided internal or external to the IC 500 using voltage regulators or other methods known in the art.

Referring now to FIG. 5B, a more detailed view is shown of an embodiment of first capacitor bank 850 driven by outputs 730 of response unit 570. Bank 850 contains a plurality of switches, 861, 863, 865 and 867 for connection of respective charge storage units, i.e., capacitors, 870, 872, 874 and 878 to high voltage supply rail 800. A plurality of switches 860, 862, 864 and 868 are also provided for connection of units 870, 872, 874 and 878 to voltage supply rail 810. Storage units 870, 872, 874 and 878 are designed for reliable operation when the potential between 800 and 830 is applied. Units 870, 872, 874 and 878 may be of equal charge storage capability or may sized to store varying amounts of charge using binary or other weighting techniques.

Each set of switches {860,861}, {862,863}, {864,865} and {866,867} is driven by a corresponding delay/control unit 700 block of response unit 570 allowing for individual selection of charge storage units 870, 872, 874 and 878. When switch 861 is enabled by signal 732, switch 860 is disabled by signal 731 and element 870 is restored using high voltage supply rail 800. When 861 is disabled and 860 enabled, charge stored at the higher potential on charge storage unit 870 is available to counteract a noise event on power supply rail 810 which operates at a lower potential. In a similar manner, charge storage unit 878 is restored by enabling signal 734 and switch 867 or used for noise suppression by enabling signal 733 and switch 866. While the example embodiment of a bank of response 570 in FIG. 5B illustrates only noise suppression on voltage supply rail 810, one skilled in the art would recognize that noise on reference rail 820 may be suppressed in a similar manner.

Figure 6:
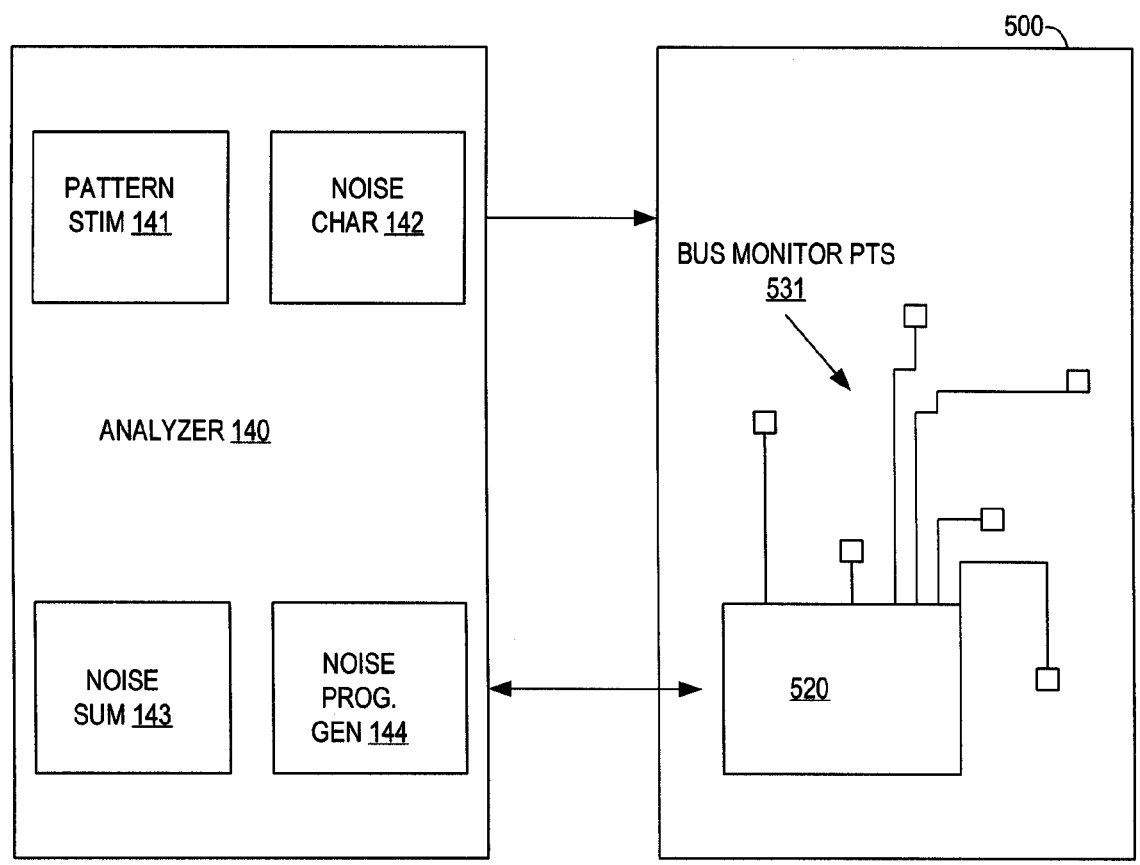
FIG. 6 illustrates an IC with the anti-noise machine of FIG. 3 connected to a noise event analyzer for validation and tuning of the anti-noise machine, according to an embodiment of the present invention.

An apparatus for implementing IC validation process 420 of FIG. 2 is illustrated in FIG. 6, according to an embodiment of the present invention. IC 500 containing anti-noise machine 520 is further provided with a means of monitoring power supply noise, bus monitoring points 531 within the IC. Bus monitoring points may include externally accessible, analog-to-digital converters (ADCs), or other measurement means known in the art.

Once manufactured, IC 500 is connected to analyzer 140. Analyzer 140 contains pattern stimulus logic 141 for providing characterization vectors or patterns to IC 500. Patterns provided may include simulation patterns used to predict the noise of IC 500 during IC design process 410. Bus monitor points 531 are used during characterization to monitor noise within IC 500 in accordance with step 290, FIG. 2. Noise characterizer 142 and noise summarizer 143 post-process noise results in a manner similar to noise summarization step 230 of FIG. 2. Implementing step 310 of FIG. 2, noise programming generator 144 defines alterations in programming of anti-noise machine 520 originally defined in steps 240 through 260 of FIG. 2 in accordance with hardware limitations of the anti-noise machine. Monitor points 531 within IC 500 cannot be altered during IC validation process 420, however, redefinition of NPS vector and response can be made to alter the noise profile of IC 500 post manufacturing. Redefinition of anti-noise programming is accomplished in accordance with step 320 FIG. 2 through connection of IC 500 to analyzer 140.

The terms "logic," "function," "unit," "controller," "analyzer," "characterizer," "summarizer," "generator," "memory," and the like are used herein. It should be understood that these terms may refer to circuitry that is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The description of the present embodiment has been presented for purposes of illustration, but is not intended to be exhaustive or to limit the invention to the form disclosed. Many modifications and variations will be apparent to those of ordinary skill in the art. For example, it should be understood that the logical functions and processes described herein may be implemented by a processor or application-specific integrated circuitry in which the processes of the present invention are capable of being distributed in the form of a computer readable medium of instructions (also known as a "software program"). Such computer readable medium may have a variety of forms. The present invention applies equally regardless of the particular type of signal bearing media actually used to carry out the distribution. Examples of computer readable media include recordable-type media such a floppy disc, a hard disk drive, a RAM, and CD-ROMs and transmission-type media such as digital and analog communications links.

Herein an embodiment of the invention has been shown in which a response unit 570 has banks of capacitors for generating a voltage change, i.e., anti-noise, by capacitor discharging. In another embodiment of the invention, the response unit includes active current sources for generating anti-noise. That is, according to such an embodiment, a response unit 570 controller for such a current source is operable to trigger the anti-noise source to generate anti-noise on the first power supply rail for the functional logic responsive to receiving the response data from the buffer. Since in various embodiments of the invention anti-noise may be generated by means of discharging one or more capacitors, injecting current from one or more active current sources, etc., any such noise means is referred to herein as a noise source. It should be understood that although the term "anti-noise" is used herein, this simply refers to noise, i.e., voltage change, that is deliberately caused for the purpose of counteracting other noise that is expected to occur.

To reiterate, the embodiments were chosen and described in order to best explain the principles of the invention, the practical application, and to enable others of ordinary skill in the art to understand the invention. Various other embodiments having various modifications may be suited to a particular use contemplated, but may be within the scope of the present invention.

Unless clearly and explicitly stated, the claims that follow are not intended to imply any particular sequence of actions. The inclusion of labels, such as a), b), c) etc., for portions of the claims does not, by itself, imply any particular sequence, but rather is merely to facilitate reference to the portions.

What is claimed is:

1. An integrated circuit device, comprising:
    functional logic;
    an anti-noise machine; and
    state monitoring points providing the anti-noise machine with an interface to the functional logic for monitoring states of the functional logic, wherein the anti-noise machine includes:
        i) indicia defining noise precursor states for the functional logic, and
        ii) recognition logic coupled to the state monitor points, the anti-noise machine being operable to generate anti-noise responsive to the recognition logic detecting noise precursor states in the functional logic via the state monitor points, wherein the noise precursor states match the indicia.

2. The device of claim 1, comprising:
    a memory having noise response data corresponding to the indicia stored therein, wherein responsive to detecting a noise precursor state matching one of the indicia the recognition unit is operable to decode the indicia to an address in the memory for the indicia's corresponding response data; and
    a buffer having an input, an output and a predetermined throughput latency there between corresponding to latency of noise events with respect to the noise precursor states, wherein the recognition unit is operable in cycles to successively load respectively addressed response data into the buffer input for triggering the anti-noise machine to generate the anti-noise at predetermined times with respect to the noise events responsive to the response data being output by the buffer.

3. The device of claim 2, comprising:
    a first power supply rail for the functional unit supplied at a first voltage level;
    a second supply rail supplied at a second voltage level elevated above the first voltage level;
    a response unit having a number of capacitors and controllers for the respective capacitors, an electrode of a first such capacitor being coupled by a first switch to the first power supply rail and by a second switch to the second power supply rail, wherein the controller for the first capacitor is operable to charge the first capacitor to the second voltage level via the first capacitor's second switch, receive the response data from the buffer output, and generate the anti-noise responsive to the received response data, and wherein generating the anti-noise includes the controller for the first capacitor discharging the charged capacitor to the first power supply rail via the charged capacitor's first switch.

4. The device of claim 3, comprising:
    a second such capacitor coupled by a first switch for the second capacitor to the first power supply rail and by a second switch for the second capacitor to the second power supply rail, wherein the controller for the second capacitor is operable to conductively couple the second capacitor to the second power supply rail via the second capacitor's second switch concurrently with the discharging of the first capacitor.

5. The device of claim 2, comprising:
    a first power supply rail for the functional unit supplied at a first voltage level;
    a second supply rail supplied at a second voltage level elevated above the first voltage level;
    a response unit having a number of current sources and controllers for the respective current sources, such a current source being coupled to the first and second power supply rails, wherein the controller for the current source is operable to receive the response data from the buffer output and generate the anti-noise responsive to the received response data, wherein generating the anti-noise includes the controller triggering the current source to inject current to the first power supply rail.

6. The device of claim 3, including a clock operable to generate a timing signal for operating cycles and wherein the response data includes packets having timing adjustment portions, wherein such a controller is operable to adjust timing of the triggering relative to the timing signal responsive to the timing adjustment portion of such a response data packet.

7. The device of claim 1, wherein the functional logic includes clock domains and the precursor states include activation or deactivation of such a clock domain.

8. The device of claim 1, wherein the functional logic includes functional regions and the precursor states include activation or deactivation of such a region.

9. The device of claim 1, wherein the functional logic includes arrays and the precursor states include an access to such an array.

10. The device of claim 1, wherein the functional logic is operable to perform a certain series of operations and the precursor states include a state wherein instructions are queued in the functional logic for the certain series.

11. A method for reducing noise in an integrated circuit device, the method comprising:
    monitoring states of functional logic in an integrated circuit device by recognition logic of an anti-noise machine, wherein the anti-noise machine includes indicia defining noise precursor states for the functional logic and a memory having noise response data corresponding to the indicia stored therein;
    decoding the indicia to addresses in the memory for the indicia's corresponding response data responsive to the recognition logic detecting noise precursor states in the functional logic, wherein the noise precursor states match the indicia;
    loading respectively addressed response data into a buffer input, the buffer having an input, an output and a predetermined throughput latency there between corresponding to latency of noise events with respect to the noise precursor states; and generating anti-noise at predetermined times with respect to the noise events responsive to the noise response data being output by the buffer.

12. The method of claim 11, wherein the integrated circuit device includes a first power supply rail for the functional unit supplied at a first voltage level, a second supply rail supplied at a second voltage level elevated above the first voltage level, and a response unit having a number of capacitors and controllers for the respective capacitors, an electrode of a first such capacitor being coupled by a first switch to the first power supply rail and by a second switch to the second power supply rail, the method including:
    charging the first capacitor to the second voltage level by the controller for the first capacitor conductively coupling the first capacitor to the second supply rail via the first capacitor's second switch; and
    discharging the charged capacitor by the controller for the first capacitor responsive to receiving the response data from the buffer output, wherein the discharging includes the controller for the first capacitor conductively coupling the first capacitor to the first power supply rail via the charged capacitor's first switch.

13. The method of claim 12, a second such capacitor coupled by a first switch for the second capacitor to the first power supply rail and by a second switch for the second capacitor to the second power supply rail, the method including:
  charging the second capacitor by the controller for the second capacitor, including conductively coupling the second capacitor to the second power supply rail via the second capacitor's second switch, wherein the charging includes charging the second capacitor concurrently with the discharging of the first capacitor.

14. The method of claim 11, wherein the integrated circuit device includes a first power supply rail for the functional unit supplied at a first voltage level, a second supply rail supplied at a second voltage level elevated above the first voltage level, and a response unit having a number of current sources and controllers for the respective current sources, a first electrode of such a current source being coupled by a switch to the first power supply rail and a second electrode of such a current source being coupled to the second power supply rail, the method including:
  connecting the current source conductively to the first power supply rail via the current source's switch responsive to the controller for the current source receiving the response data from the buffer output.

15. The method of claim 12, comprising:
  generating a clock signal for operating cycles; and
  adjusting timing of the discharging relative to the clock signal, wherein the adjusting is responsive to timing adjustment portions of the response data packets.

16. The method of claim 11, comprising:
  simulating noise events for nodes within the functional logic responsive to predetermined simulation patterns;
  defining states of the functional logic, wherein the states precede respective ones of the simulated noise events; and
  forming indicia of noise precursor states in the anti-noise machine responsive to magnitudes of the noise events and the defined states of the functional logic.

17. The method of claim 16, wherein the simulation patterns include simulated instructions and operand data and such a state include ones of the simulated instructions and operand data.

18. An integrated circuit device, comprising:
  functional logic;
  recognition logic coupled to the functional logic and operable to monitor states of the functional logic, wherein the recognition logic includes indicia defining noise precursor states of the functional logic;
  a memory having noise response data corresponding to the indicia stored therein, wherein responsive to detecting a noise precursor state matching one of the indicia the recognition unit is operable to decode the indicia to an address in the memory for the indicia's corresponding response data;
  a buffer having an input, an output and a predetermined throughput latency there between corresponding to latency of noise events with respect to the noise precursor states, wherein the recognition unit is operable in cycles to successively load respectively addressed response data into the buffer input; and
  a response unit having a number of noise sources and controllers for the respective noise sources, wherein the controller for such a noise source is operable to trigger the noise source to generate noise on a first power supply rail for the functional logic responsive to receiving the response data from the buffer.

19. The device of claim 18, including a clock operable to generate a timing signal for operating cycles and wherein the response data includes packets having timing adjustment portions, wherein such a controller is operable to adjust timing of the triggering relative to the timing signal responsive to the timing adjustment portion of such a response data packet.

20. The device of claim 19, wherein the noise precursor states include at least one of the following: a state wherein a clock domain of the functional logic is activated or deactivated, a state wherein a functional region of the functional logic is activated or deactivated, a state wherein an array of the functional logic is accessed, and a state wherein instructions are queued in the functional logic for a certain series of functional logic operations.

* * * * *